United States Patent
Hasegawa et al.

(10) Patent No.: US 6,914,430 B2
(45) Date of Patent: Jul. 5, 2005

(54) NMR PROBE

(75) Inventors: Kenichi Hasegawa, Akishima (JP); Toshihiro Saguchi, Akishima (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/751,669

(22) Filed: Jan. 5, 2004

(65) Prior Publication Data

US 2005/0122107 A1 Jun. 9, 2005

(30) Foreign Application Priority Data

Jan. 6, 2003 (JP) .................................. 2003-000169
Dec. 4, 2003 (JP) .................................. 2003-405926

(51) Int. Cl.[7] ................................................ G01V 3/00
(52) U.S. Cl. .................................. 324/315; 324/307
(58) Field of Search .................................. 324/315, 318, 324/322, 321, 309, 307, 300

(56) References Cited

U.S. PATENT DOCUMENTS 5,508,613 A * 4/1996 Kotsubo et al. ............ 324/318
6,329,820 B1 * 12/2001 Hasegawa et al. ......... 324/315

FOREIGN PATENT DOCUMENTS

| JP | 10-307175 | 11/1998 |
| JP | 10-332801 | 12/1998 |
| JP | 2001-153938 | 6/2001 |

* cited by examiner

Primary Examiner—Brij B. Shrivastav
(74) Attorney, Agent, or Firm—The Webb Law Firm

(57) ABSTRACT

A nuclear magnetic resonance (NMR) probe is offered which can minimize positional shift of the detector portion caused by shrinkage of the support post due to cooling of the detector portion. The NMR probe has a vacuum-insulated container and the detector portion described above. The container has a cylindrical portion inserted in a magnet. The detector portion is made up of a detection coil and a tuning and matching circuit that are placed within the container. The detector portion is cooled by a cooling means such that NMR signals are detected with enhanced sensitivity. This probe is characterized in that the detector portion is mounted to the upper end surface or a side surface of the cylindrical portion.

10 Claims, 6 Drawing Sheets

NMR PROBE

BACKGROUND OF THE INVENTION

1. Field of the Invention

The present invention relates to an NMR (nuclear magnetic resonance) probe and, more particularly, to an NMR probe having a detector portion cooled down to cryogenic temperatures by low-temperature helium gas such that NMR signals are detected with enhanced sensitivity.

2. Description of Related Art

A nuclear magnetic resonance spectrometer is an instrument for observing the NMR signal produced from a sample by applying an intense static magnetic field to the sample such that the magnetic moments of atomic nuclei having nuclear spins within the sample are induced to precess about the static field, then causing the magnetic moments of the atomic nuclei to precess by applying an RF magnetic field perpendicular to the direction of the static magnetic field, and detecting the NMR signal as an RP magnetic field intrinsic to the sample. The NMR signal is emitted when the precessional motion of the magnetic moments of the atomic nuclei returns from excited state to ground state.

The NMR signal is normally quite weak. To enhance the detection sensitivity, piping for low-temperature gas is mounted in the NMR probe having a built-in detector portion. The detector portion is cooled down to cryogenic temperatures, thus reducing thermal noise in the NMR instrument. In this way, the sensitivity of the NMR instrument is enhanced (see Japanese Patent Laid-Open No. 307175/1998, Japanese Patent Laid-Open No. 332801/1998, and Japanese Patent Laid-Open No. 153938/2001).

The positional relation between the prior art NMR probe and a superconducting magnet for producing a static magnetic field is shown in FIG. 1. A main coil B of superconducting wire is wound inside the superconducting magnet A. The main coil B is usually placed within a thermally insulated container (not shown) capable of holding liquid helium or the like, and cooled down to cryogenic temperatures. An NMR probe C is made up of a base portion 40 placed outside the magnet and a cylindrical portion 41 inserted in the magnet. The superconducting magnet A is provided with a cylindrical hole D extending along the central axis. The cylindrical portion 41 is usually inserted into the hole D by moving the cylindrical portion 41 upwardly from the lower opening portion.

The structure of the prior art NMR probe is shown in FIG. 2. A vacuum-insulated container 13 is made up of the base portion 40 placed outside the magnet in conformity with the shape of the NMR probe and a cylindrical portion 41 inserted in the magnet. In the container 13, a cooler 8 is supported by a support post 5 whose one end is mounted to the lower end surface of the container 13. A detector portion 1, made up of a detection coil 2 and a tuning and matching circuit 3, is in thermal contact with and held to the cooler 8. The detection coil 2 is wound along the outer surface of a cylindrical bobbin 15. The center 11 of the detection coil 2 is set at a position where the magnetic homogeneity is optimal within an external static magnetic field produced by a superconducting magnet (not shown).

Thermally insulated piping consisting of a transfer line 7 and a pipe 4 is connected with the cooler 8. The transfer line 7 is used to inject and discharge a low-temperature refrigerant, such as low-temperature helium gas.

A gas pipe 6 for varying the temperature of the sample extends along the center axis of the cylindrical bobbin 15 around which the detection coil 2 is wound. The intersection of the gas pipe 6 and the wall of the vacuum-insulated container 13 is vacuum-sealed by an O-ring 30. In particular, the bobbin 15 is disposed coaxially with the gas pipe 6 used for varying the temperature of the sample. The detection coil 2 is disposed coaxially with the gas pipe 6 and bobbin 15 outside the bobbin 15. Gas used to vary the temperature of the sample is drawn through the gas pipe 6 from bottom to top.

A sample tube 12 holding a sample 14 to be investigated is inserted in the downward direction coaxially with the gas pipe 6 on the inner side of the gas pipe 6 for varying the temperature of the sample such that the center of the sample 14 is coincident with the center of detection 11 of the detection coil 2.

In this structure, the low-temperature refrigerant, such as low-temperature helium gas, is injected into the cooler 8 from the outside through the transfer line 7 and pipe 4, thus cooling both the detection coil 2 and tuning and matching circuit 3 of the detector portion 1. This enhances the Q value of the detection coil 2 and reduces thermal noise in the detection coil 2 and in the tuning and matching circuit 3. This, in turn, improves the sensitivity of the NMR instrument. At the same time, a temperature-controlled gas (variable temperature (VT) gas) is injected into the gas pipe 6 for varying the sample temperature from below to maintain the sample 14 at an appropriate temperature.

The prior art NMR probe cooled down to low temperatures has one problem. As shown in FIG. 3, the center of the detection coil 2 drops to a position 11' by shrinkage of the support post 5 due to cooling. Therefore, the detection coil 2 deviates from the portion of the highest homogeneity within the static magnetic field. This deteriorates the homogeneity of the static field, impairing the spectral resolution. It is necessary to correct this positional deviation after a lapse of a sufficient time to wait until the inside of the vacuum-insulated container 13 comes to a thermal equilibrium. Consequently, the adjusting work is time consuming and the reproducibility is poor.

SUMMARY OF THE INVENTION

In view of the foregoing, it is an object of the present invention to provide an NMR probe in which positional deviation of the detector coil and detector portion or assembly caused by shrinkage of a support post due to cooling of the detector portion can be suppressed to a minimum.

This object is achieved by an NMR probe according to the present invention. The probe comprises a vacuum-insulated container and a detector portion supported within the container. The vacuum-insulated container has a cylindrical portion sized for insertion into the assembly that establishes an intense static magnetic field. The detector portion or assembly comprises a detection coil and a tuning and matching circuit that are placed within the container. The detector portion is cooled by a cooling apparatus to enhance the sensitivity at which NMR signals are detected. This NMR probe is characterized in that the detector portion is mounted to the upper end surface or a side surface of the cylindrical portion of the vacuum-insulated container.

In one feature of the present invention, the detector portion is fitted with a gas pipe for varying the temperature of the sample. The pipe extends along the center axis of the detector portion. A bobbin is placed coaxially with the gas pipe outside this pipe. The detection coil is placed coaxially with the gas pipe and bobbin outside the bobbin. The sample is positioned in a sample tube within the gas pipe.

In another feature of the present invention, the detector portion is mounted to the upper end surface or side surface of the cylindrical portion via a heat-insulating member.

In a further feature of the present invention, the detector portion is grounded via a thin plating formed on the surface of the heat-insulating member.

In still another feature of the present invention, the detector portion is grounded via a thin metal foil sandwiched between the heat-insulating member and the vacuum-insulated container.

In yet another feature of the present invention, the detector portion is cooled by low-temperature helium gas conveyed to the cooling apparatus.

In an additional feature of the present invention, the cooling apparatus is fitted with a pipe through which a refrigerant flows. The pipe has a resilient or movable portion in at least a part thereof.

In a still other feature of the present invention, the detector portion is supported by a support post that is firmly secured to the vacuum-insulated container. At least a part of the support post has a resilient or movable portion that absorbs tensile force or distorting force applied to the support post during thermal shrinkage. This portion may expand to accommodate shrinkage of other portions.

In yet another feature of the present invention, the detector portion is supported by a support post that is firmly secured to the vacuum-insulated container. The support post is in thermal contact with a gas pipe through which a temperature control gas flows, the gas being temperature controlled around room temperature. Thus, the instrument is so configured that thermal shrinkage is avoided.

The present invention also provides an NMR probe having a vacuum-insulated container and a detector portion. The vacuum-insulated container has a cylindrical portion inserted in a magnet. The detector portion is made up of a detection coil and a tuning and matching circuit that are placed within the container. The detector portion is cooled by a cooling apparatus to enhance the sensitivity at which NMR signals are detected. This NMR probe is characterized in that the cooling apparatus has a support post firmly mounted to the lower end surface of the vacuum-insulated container and that the support post is in thermal contact with a gas pipe through which a gas flows, the gas being temperature controlled around room temperature. In this manner, thermal shrinkage is prevented.

Other objects and features of the invention will appear in the course of the description thereof, which follows.

DESCRIPTION OF THE PREFERRED EMBODIMENTS

Figure 4:
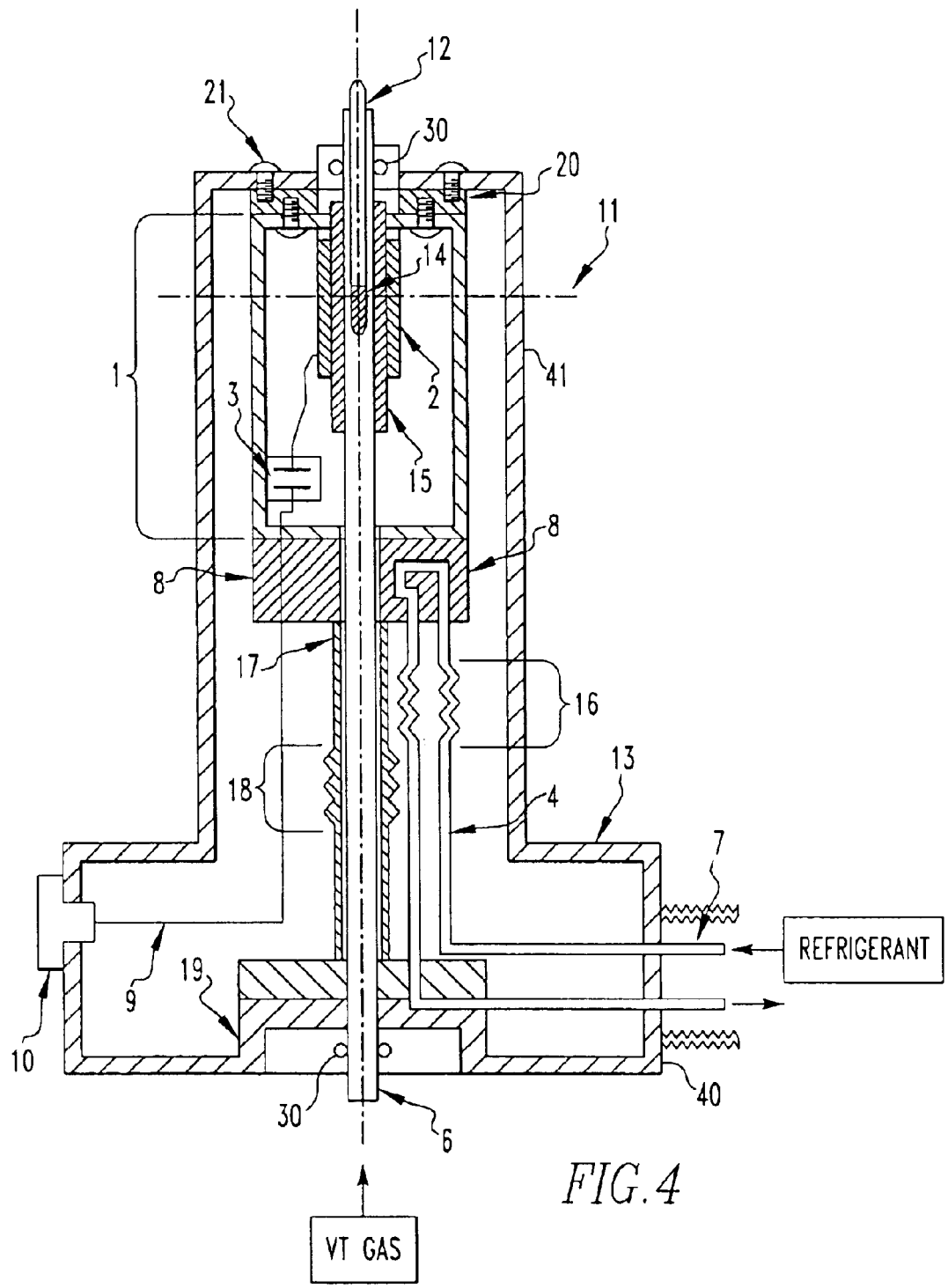
FIG. 4 is a cross-sectional view of an NMR probe according to one embodiment of the present invention.

Preferred embodiments of the present invention are hereinafter described with reference to the accompanying drawings. FIG. 4 shows an NMR probe according to one embodiment of the present invention. This probe has a vacuum-insulated container 13 made up of a base portion 40 placed outside a magnet in conformity with the shape of the NMR probe and a cylindrical portion 41 inserted in the magnet. In the vacuum-insulated container 13, a support post 17 is firmly secured to the lower end surface of the vacuum-insulated container 13. A cooler 8 is supported by the support post 17. A detector portion 1 made up of a detection coil 2 and a tuning and matching circuit 3 is in thermal contact with and held to the cooler 8. In this embodiment, the support post 17 takes the form of a hollow cylinder and is made to stand within the vacuum-insulated container 13 via a pedestal 19. Note that the support post 17 is not always required to be shaped as a hollow cylinder. In addition, in the embodiment described above, the detector portion 1 is supported by the support post 17 via the cooler 8. The detector portion 1 may also be directly supported by the support post 17 without the interposed cooler 8.

The detector portion 1 is also mounted to the upper end surface of the cylindrical portion 41 of the vacuum-insulated container 13 by means of securing parts 21 via an intervening heat-insulating member 20. The surface of the heat-insulating member 20 is quite thinly plated 20a to suppress the thermal conduction to a sufficiently low level. Thus, the detector portion 1 can be grounded while sufficiently thermally insulated if the vacuum-insulated container 13 is preset to ground potential. In consequence, the detector portion 1 is electrically stabilized. Instead of plating the surface, a quite thin metal foil 20a may be interposed. Furthermore, the detector portion 1 may be mounted to a side surface of the cylindrical portion 41 of the vacuum-insulated container 13 via an intervening heat-insulating member. The shape itself of the heat-insulating member 20 may be modified variously. For instance, the heat-insulating member 20 may be so shaped that it depends from the upper end surface of the cylindrical portion 41.

The detection coil 2 mounted in the detector portion 1 is wound along the outer surface of the cylindrical bobbin 15. The center of detection 11 of the detection coil 2 is set to a position where the magnetic homogeneity is highest within the external static magnetic field set up by a superconducting magnet (not shown).

Thermally insulated piping consisting of a transfer line 7 and a pipe 4 is connected with the cooler 8. The transfer line 7 is used to inject and discharge a low-temperature refrigerant, such as low-temperature helium gas.

A gas pipe 6 for varying the temperature of the sample extends along the center axis of the cylindrical bobbin 15 around which the detection coil 2 is wound. The intersection of the gas pipe 6 and the wall of the vacuum-insulated container 13 is vacuum-sealed by an O-ring 30. In particular, the bobbin 15 is disposed coaxially with the gas pipe 6 outside this pipe 6 used for varying the temperature of the sample. The detection coil 2 is disposed coaxially with the gas pipe 6 and bobbin 15 outside the bobbin 15. Gas used to vary the temperature of the sample is drawn through the gas pipe 6 from bottom to top.

A sample tube 12 holding a sample 14 to be investigated is inserted in the downward direction coaxially with the gas pipe 6 on the inner side of the gas pipe 6 for varying the temperature of the sample such that the center of the sample 14 is coincident with the center of detection 11 of the detection coil 2.

The detection coil 2 is connected with a spectrometer (not shown) by a connector 10 mounted outside the vacuum-insulated container 13 through the tuning and matching circuit 3 and cable 9. Resilient expansible (movable) portions 16 and 18 are formed between the support post 17 and pipe 4.

In this structure, the low-temperature refrigerant, such as low-temperature helium gas, is injected into the cooler 8 from the outside through the transfer line 7 and pipe 4, thus cooling the detection coil 2 of the detector portion 1 and tuning and matching circuit 3. This enhances the Q value of the detection coil 2 and reduces thermal noise in the detection coil 2 and in the tuning and matching circuit 3. This, in turn, improves the sensitivity of the NMR instrument. At the same time, a temperature-controlled or variable temperature (VT) gas is injected from below into the gas pipe 6 for varying the sample temperature to maintain the sample 14 at an appropriate temperature.

Figure 2:
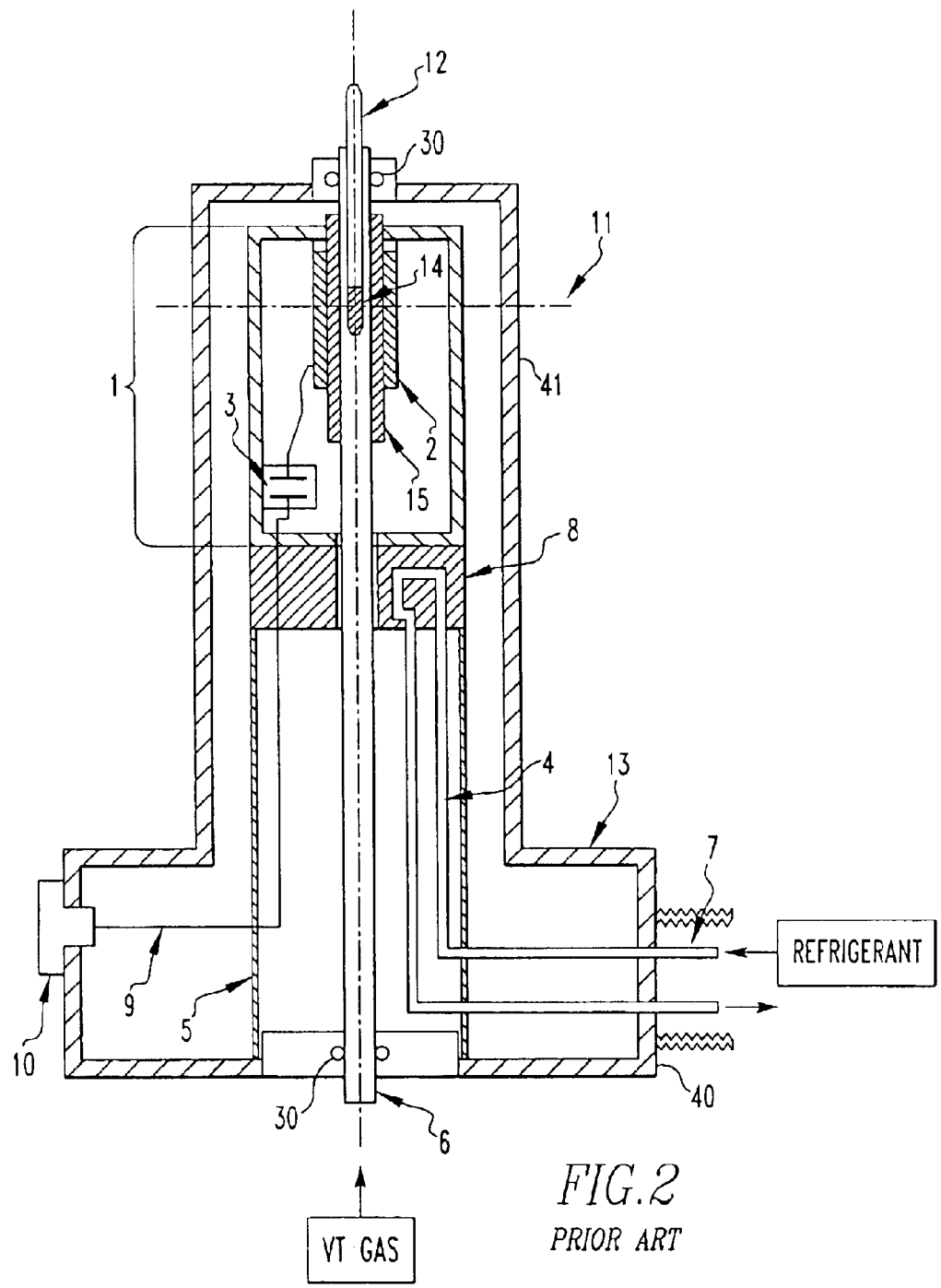
FIGS. 2 and 3 are cross-sectional views of the prior art NMR probe.
Figure 3:
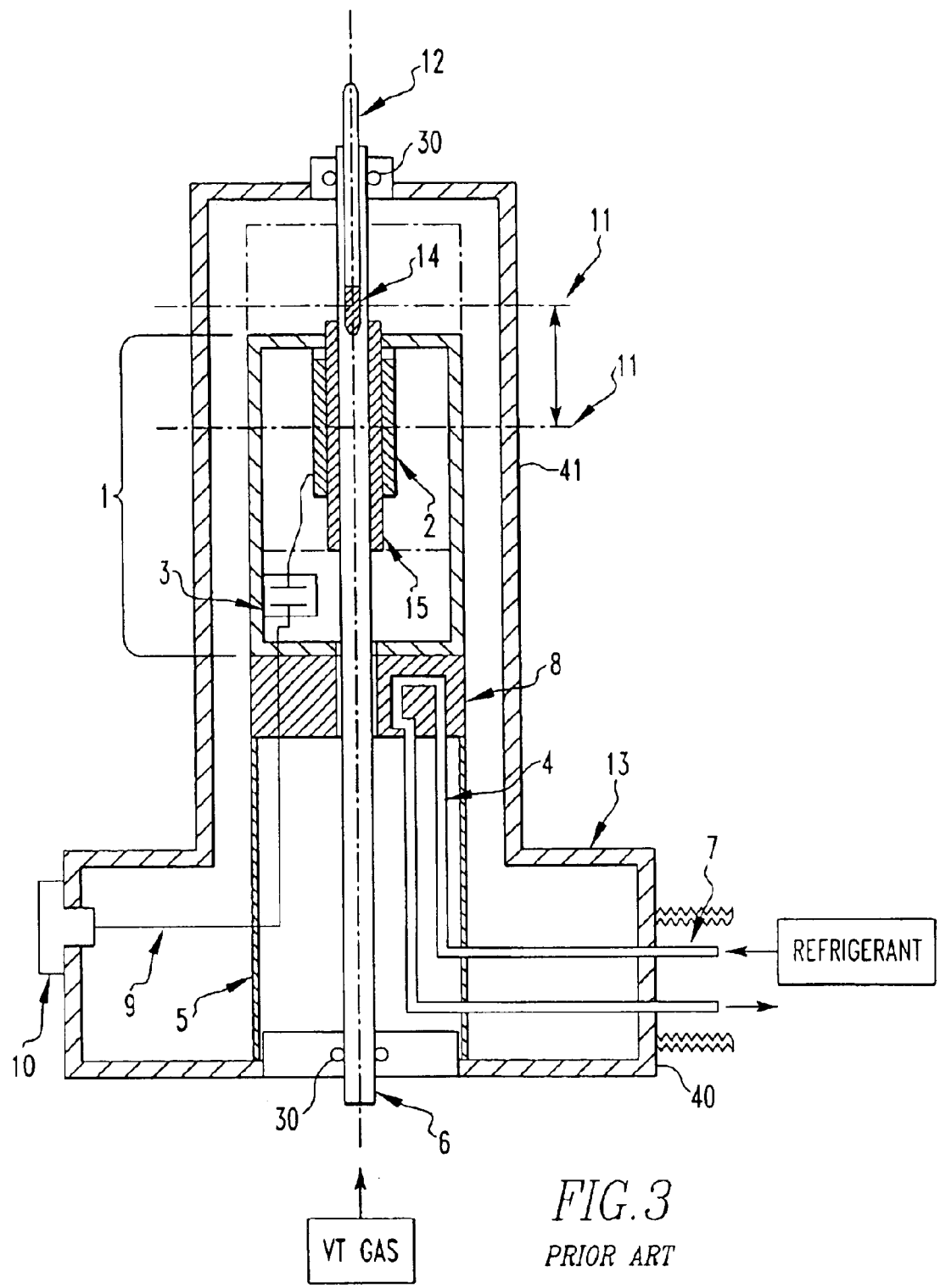

The detector portion 1 is mounted to the end surface of the vacuum-insulated container 13 closer to the position where the detector portion 1 is installed, i.e., mounted to the upper end surface of the cylindrical portion 41 or an end surface of the cylindrical portion 41, via an intervening heat-insulating member 20. Since the heat-insulating member 20 and detector portion 1 are sufficiently shorter than the prior art support post 5 shown in FIG. 2, the position of the center of detection 11 of the detection coil 2 shifts only infinitesimally even if the heat-insulating member 20 and detector portion 1 thermally shrink due to cooling. As a result, if the cooler 8 cools the detector portion 1 down to cryogenic temperatures, the center of detection 11 of the detection coil 2 is prevented from deviating from the portion where the magnetic homogeneity is highest within the static magnetic field.

Furthermore, tensional force or distorting force applied to the support post 17 and pipe 4 due to thermal shrinkage is mitigated by elongation or shrinkage of the resilient expansible portions 16 and 18 mounted in the intervening positions. Consequently, it is unlikely that strong tensile or distorting force is applied to the support post 17 and pipe 4. As a result, the detection coil 2 mounted in the detection portion 1 can be maintained at the optimum position within the vacuum-insulated container 13. The expansible or movable portions 16 and 18 may be replaced by bellows or the like.

Figure 5:
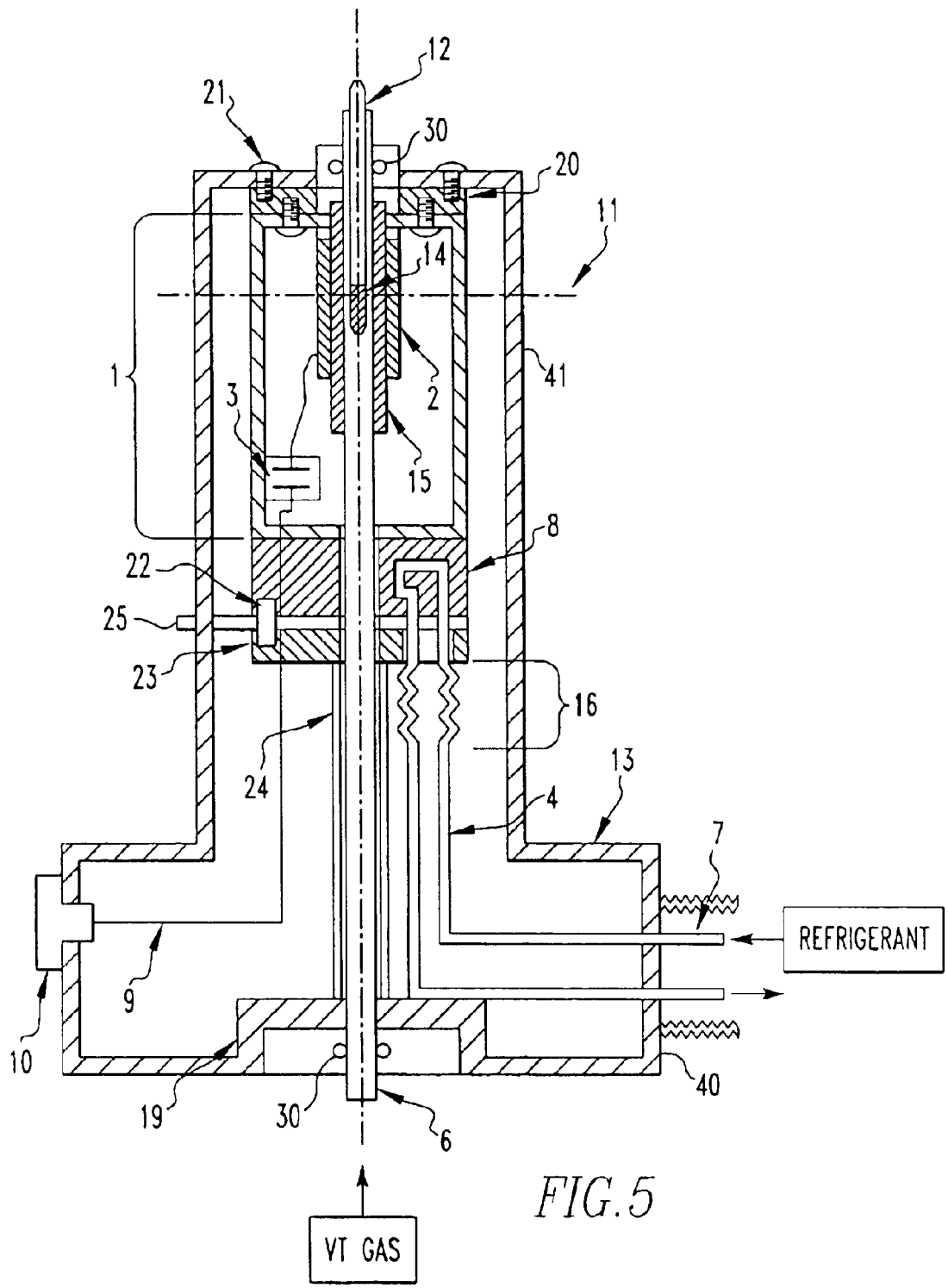
FIG. 5 is a cross-sectional view of an NMR probe according to another embodiment of the present invention.

FIG. 5 shows an NMR probe according to another embodiment of the present invention. This probe has a vacuum-insulated container 13 made up of a base portion 40 placed outside a magnet in conformity with the shape of the NMR probe and a cylindrical portion 41 inserted in the magnet. In the vacuum-insulated container 13, a pedestal 19 is firmly secured to the lower end surface of the container 13, and a support post 24 stands on the pedestal 19. A pin 22 stands on a heat-insulating material 23 mounted to the support post 24. The pin 22 is inserted in a recessed portion formed in a cooler 8. A gap 25 of variable width (movable portion) is formed between the cooler 8 and heat-insulating material 23 to permit the portions located above the cooler 8 to move up and down without trouble. The detector portion 1 made up of the detection coil 2 and tuning and matching circuit 3 is in thermal contact with and held to the cooler 8.

The detector portion 1 is also mounted to the upper end surface of the cylindrical portion 41 of the vacuum-insulated container 13 by means of securing parts 21 via an intervening heat-insulating member 20. The surface of the heat-insulating member 20 is quite thinly plated to suppress the thermal conduction to a sufficiently low level. Thus, the detector portion 1 can be grounded while sufficiently thermally insulated if the vacuum-insulated container 13 is preset to ground potential. In consequence, the detector portion 1 is electrically stabilized. Instead of plating the surface, a quite thin metal foil may be interposed. Furthermore, the detector portion 1 may be mounted to a side surface of the cylindrical portion 41 of the vacuum-insulated container 13 via an intervening heat-insulating member. The shape itself of the heat-insulating member 20 may be modified variously. For instance, the heat-insulating member 20 may be so shaped that it depends from the upper end surface of the cylindrical portion 41.

The detection coil 2 mounted in the detector portion 1 is wound along the outer surface of the cylindrical bobbin 15. The center of detection 11 of the detection coil 2 is set to a position where the magnetic homogeneity is highest within the external static magnetic field set up by a superconducting magnet (not shown).

Thermally insulated piping consisting of a transfer line 7 and a pipe 4 is connected with the cooler 8. The transfer line 7 is used to inject and discharge a low-temperature refrigerant, such as low-temperature helium gas.

A gas pipe 6 for varying the temperature of the sample extends along the center axis of the cylindrical bobbin 15 around which the detection coil 2 is wound. The intersection of the gas pipe 6 and the wall of the vacuum-insulated container 13 is vacuum-sealed by an O-ring 30. In particular, the bobbin 15 is disposed coaxially with the gas pipe 6 outside this pipe 6 used for varying the temperature of the sample. The detection coil 2 is disposed coaxially with the gas pipe 6 and bobbin 15 outside the bobbin 15. Gas used to vary the temperature of the sample is drawn through the gas pipe 6 from below to top.

A sample tube 12 holding a sample 14 to be investigated is inserted in the downward direction coaxially with the gas pipe 6 on the inner side of the gas pipe 6 for varying the temperature of the sample such that the center of the sample 14 is coincident with the center of detection 11 of the detection coil 2.

The detection coil 2 is connected with a spectrometer (not shown) by a connector 10 mounted outside the vacuum-insulated container 13 through the tuning and matching circuit 3 and cable 9. A resilient expansible (movable) portion 16 is formed in the pipe 4.

In this structure, the low-temperature refrigerant, such as low-temperature helium gas, is injected into the cooler 8 from the outside through the transfer line 7 and pipe 4, thus cooling the detection coil 2 of the detector portion 1 and tuning and matching circuit 3. This enhances the Q value of the detection coil 2 and reduces thermal noise in the detection coil 2 and in the tuning and matching circuit 3. This, in turn, improves the sensitivity of the NMR instrument. At the same time, a temperature-controlled or variable temperature (VT) gas is injected from below into the gas pipe 6 for varying the sample temperature to maintain the sample 14 at an appropriate temperature.

Figure 1:
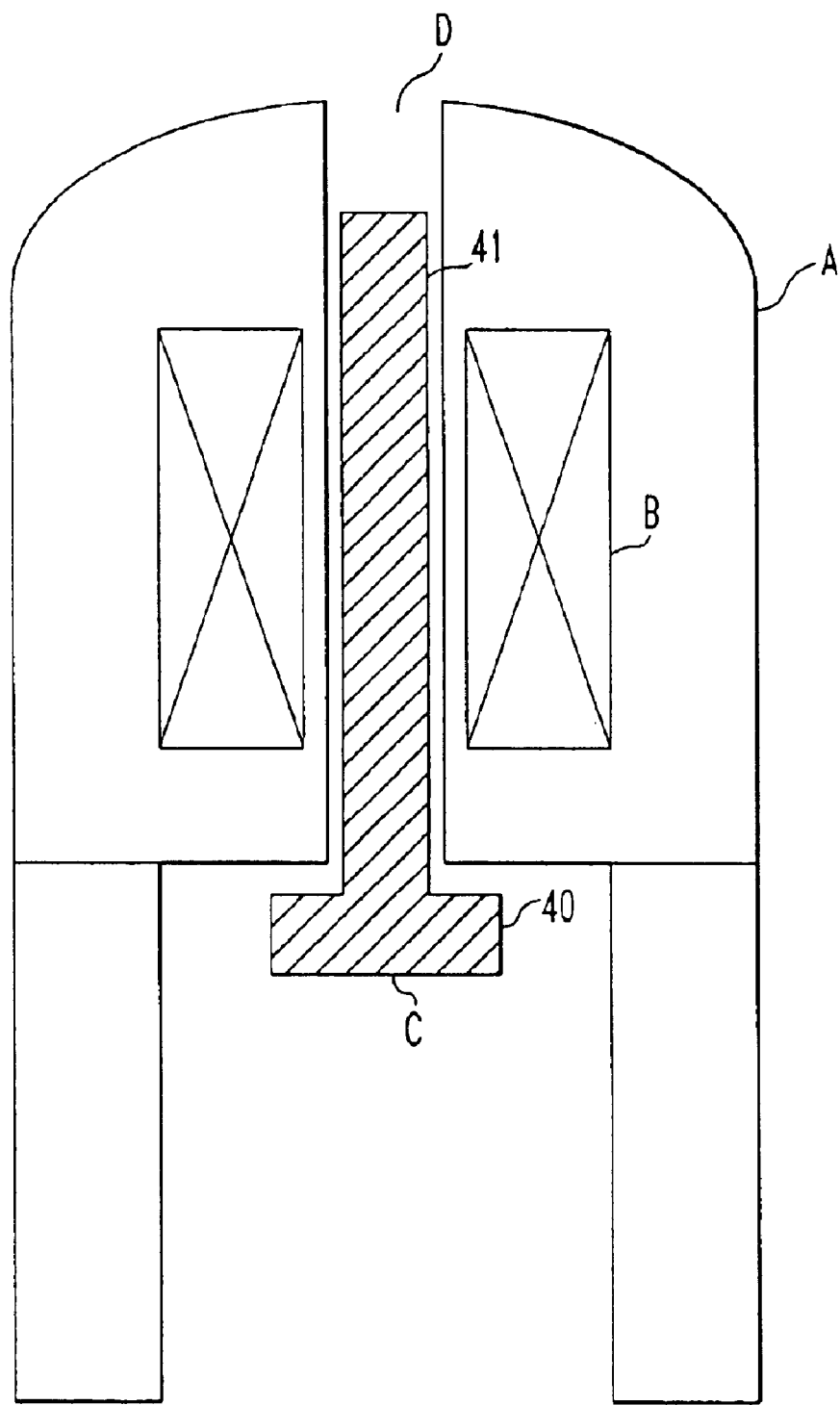
FIG. 1 is a diagram illustrating the prior art NMR instrument.

The detector portion 1 is mounted to the end surface of the vacuum-insulated container 13 closer to the position where the detector portion 1 is installed, i.e., mounted to the upper end surface of the cylindrical portion 41 or an end surface of the cylindrical portion 41, via an intervening heat-insulating member 20. Since the heat-insulating member 20 and detector portion 1 are sufficiently shorter than the prior art support post 5 shown in FIG. 1, the center of detection 11 of the detection coil 2 shifts only infinitesimally even if the heat-insulating member 20 and detector portion 1 thermally shrink due to cooling. As a result, if the cooler 8 cools the detector portion 1 down to cryogenic temperatures, the center of detection 11 of the detection coil 2 is prevented from deviating from the portion where the magnetic homogeneity is highest within the static magnetic field.

Furthermore, tensional or distorting force applied to the pipe 4 due to thermal shrinkage is mitigated by the resilient expansible portion (movable portion) 16 mounted in the intervening position. Consequently, it is unlikely that strong tensile or distorting force is applied to the pipe 4. As a result, the detection coil 2 mounted in the detection portion 1 can be maintained at the optimum position within the vacuum-insulated container 13. Thermal shrinkage of the support post 24 caused by cooling can be absorbed by forming a gap (movable portion) 25 between the heat-insulating material 23 and cooler 8, and permitting a pin 22 standing on the heat-insulating material 23 to slide within the recessed portion of the cooler 8.

Figure 6:
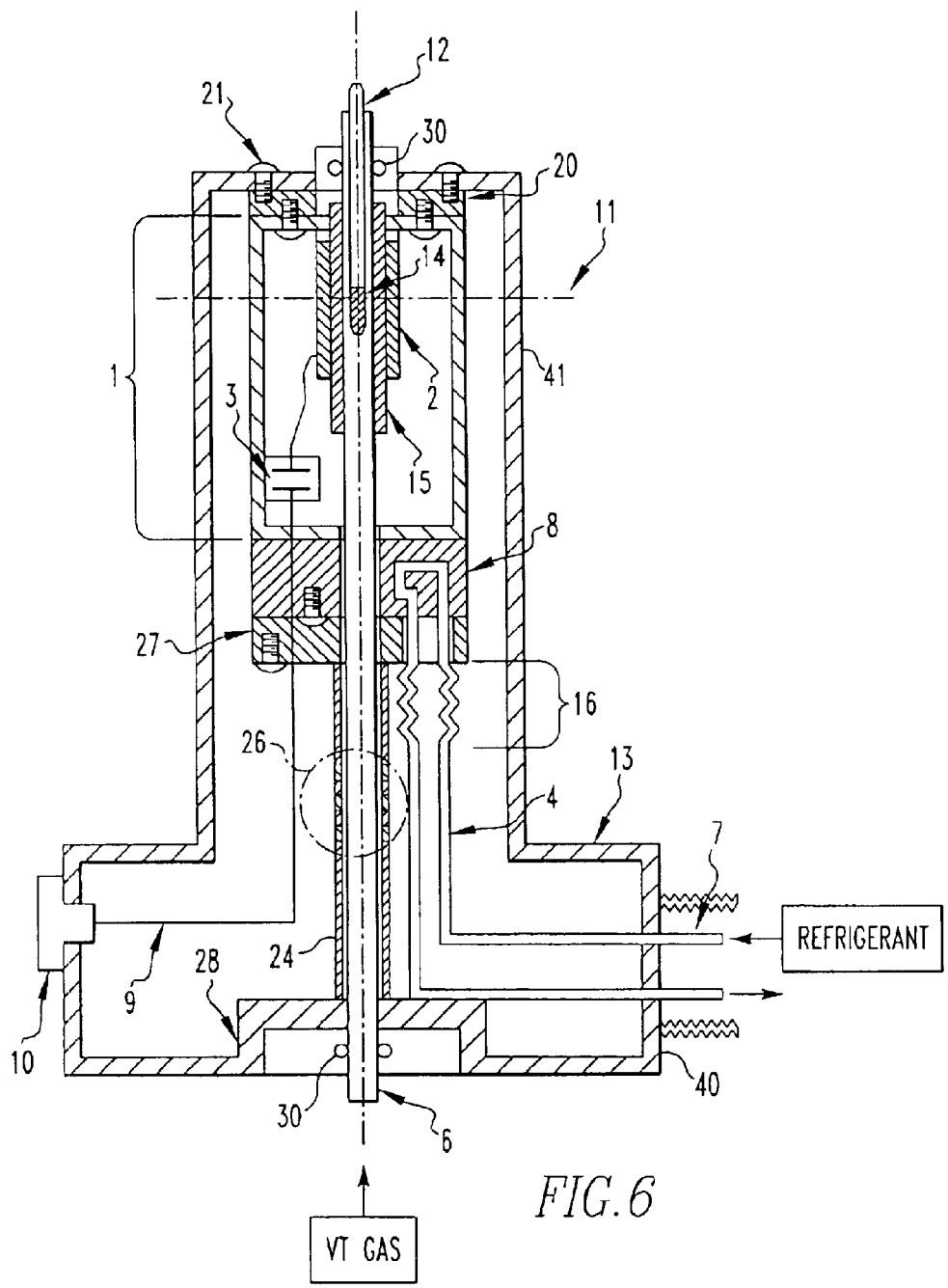
FIG. 6 is a cross-sectional view of an NMR probe according to a further embodiment of the present invention.

FIG. 6 shows an NMR probe according to a further embodiment of the present invention. This probe has a vacuum-insulated container 13 made up of a base portion 40 placed outside a magnet in conformity with the shape of the NMR probe and a cylindrical portion 41 inserted in the magnet. In the vacuum-insulated container 13, a support post 24 is firmly secured to the lower end surface of the vacuum-insulated container 13 via an intervening heat-insulating material 27. A cooler 8 is supported by the support post 24. A detector portion 1 made up of a detection coil 2 and a tuning and matching circuit 3 is in thermal contact with and held to the cooler 8. In this embodiment, the support post 24 is in thermal contact with a gas pipe 6 through which a variable temperature (VT) gas flows, the gas being temperature controlled around room temperature. The support post 24 can be maintained close to room temperature. This support post 24 is made to stand within the vacuum-insulated container 13 via a pedestal 28. In this embodiment, the detector portion 1 is supported by the support post 24 via the cooler 8. The detector portion 1 may also be directly supported by the support post 24.

The detector portion 1 is mounted also to the upper end surface of the cylindrical portion 41 of the vacuum-insulated container 13 by means of securing parts 21 via an intervening heat-insulating member 20. The surface of the heat-insulating member 20 is quite thinly plated to suppress the thermal conduction to a sufficiently low level. Thus, the detector portion 1 can be grounded while sufficiently thermally insulated if the vacuum-insulated container 13 is preset to ground potential. In consequence, the detector portion 1 is electrically stabilized. Instead of plating the surface, a quite thin metal foil may be interposed. Furthermore, the detector portion 1 may be mounted to a side surface of the cylindrical portion 41 of the vacuum-insulated container 13 via an intervening heat-insulating member. The shape itself of the heat-insulating member 20 may be modified variously. For instance, the heat-insulating member 20 may be so shaped that it depends from the upper end surface of the cylindrical portion 41.

The detection coil 2 mounted in the detector portion 1 is wound along the outer surface of the cylindrical bobbin 15. The center of detection 11 of the detection coil 2 is set to a position where the magnetic homogeneity is highest within the external static magnetic field set up by a superconducting magnet (not shown).

Thermally insulated piping consisting of a transfer line 7 and a pipe 4 is connected with the cooler 8. The transfer line 7 is used to inject and discharge a low-temperature refrigerant, such as low-temperature helium gas.

A gas pipe 6 for varying the temperature of the sample extends along the center axis of the cylindrical bobbin 15 around which the detection coil 2 is wound. The intersection of the gas pipe 6 and the wall of the vacuum-insulated container 13 is vacuum-sealed by an O-ring 30. In particular, the bobbin 15 is disposed coaxially with the gas pipe 6 outside this pipe 6 used for varying the temperature of the sample. The detection coil 2 is disposed coaxially with the gas pipe 6 and bobbin 15 outside the bobbin 15. Gas used to vary the temperature of the sample is drawn through the gas pipe 6 from below to top.

A sample tube 12 holding a sample 14 to be investigated is inserted in the downward direction coaxially with the gas pipe 6 on the inner side of the gas pipe 6 for varying the temperature of the sample such that the center of the sample 14 is coincident with the center of detection 11 of the detection coil 2.

The detection coil 2 is connected with a spectrometer (not shown) by a connector 10 mounted outside the vacuum-insulated container 13 through the tuning and matching circuit 3 and cable 9. A resilient expansible (movable) portion 16 is formed in the pipe 4.

In this structure, the low-temperature refrigerant, such as low-temperature helium gas, is injected into the cooler 8 from the outside through the transfer line 7 and pipe 4, thus cooling the detection coil 2 of the detector portion 1 and tuning and matching circuit 3. This enhances the Q value of the detection coil 2 and reduces thermal noise in the detection coil 2 and in the tuning and matching circuit 3. This, in turn, improves the sensitivity of the NMR instrument. At the same time, a temperature-controlled or variable temperature (VT) gas is injected from below into the gas pipe 6 for varying the sample temperature to maintain the sample 14 at an appropriate temperature.

The detector portion 1 is mounted to the end surface of the vacuum-insulated container 13 closer to the position where the detector portion 1 is installed, i.e., mounted to the upper end surface of the cylindrical portion 41 or an end surface of the cylindrical portion 41, via an intervening heat-insulating member 20. Since the heat-insulating member 20 and detector portion 1 are sufficiently shorter than the prior art support post 5 shown in FIG. 1, the center of detection 11 of the detection coil 2 shifts only infinitesimally even if the heat-insulating member 20 and detector portion 1 thermally shrink due to cooling. As a result, if the cooler 8 cools the detector portion 1 down to cryogenic temperatures, the center of detection 11 of the detection coil 2 is prevented from deviating from the portion where the magnetic homogeneity is highest within the static magnetic field.

The support post 24 is thermally insulated from the cooler 8 via the heat-insulating material 27, and is in thermal contact with the gas pipe 6 at a thermal contact portion 26. Gas that is temperature-controlled around room temperature flows through the gas pipe 6. Hence, the support post 24 is maintained close to room temperature. Thermal shrinkage that would normally be caused by cryogenic cooling does not occur. On the other hand, tensile force applied to the pipe 4 due to thermal shrinkage is mitigated by elongation and shrinkage of the resilient extensible portion 16 mounted in the intervening position. Consequently, strong distorting force is not applied to the pipe 4. As a result, the detection coil 2 mounted in the detector portion 1 can be maintained in the optimal position within the vacuum-insulated container 13.

In this embodiment, if the detector portion 1 is not fixed to the upper end surface of the vacuum-insulated container 13, the same advantages can be obviously had as in the case where the detector portion 1 is fixed to the upper end surface of the vacuum-insulated container 13.

As described so far, an NMR probe according to the present invention has a vacuum-isolated container and a detector portion positioned within this container having a cylindrical portion inserted in a magnet. The detector portion is made up of a detection coil and a tuning and matching circuit. The detector portion is cooled by a cooling means such that NMR signals are detected with enhanced sensitivity. The detector portion is mounted to the upper end surface or a side surface of the cylindrical portion. Consequently, positional shift of the detector portion caused by shrinkage of the support post due to cooling of the detector portion can be reduced to a minimum. As a result, the work for adjusting the resolution during NMR measurement can be facilitated. Also, the reproducibility is improved.

Having thus described our invention with the detail and particularity required by the Patent Laws, what is desired protected by Letters Patent is set forth in the following claims.

The invention claimed is:

1. An NMR probe having a vacuum-insulated container and a detector portion, the vacuum-insulated container having a cylindrical portion inserted in a magnet, the detector portion being made up of a detection coil and a tuning and matching circuit that are placed within the container, the detector portion being cooled by a cooling means such that NMR signals are detected with enhanced sensitivity, wherein said cooling means has a support post firmly mounted to a lower end surface of said vacuum-insulated container and wherein the support post is in thermal contact with a gas pipe through which a gas flows, the gas being temperature controlled around room temperature, thus forming a structure preventing thermal shrinkage.

2. An NMR probe having a vacuum-insulated container and a detector portion, the vacuum-insulated container having a cylindrical portion which may be inserted into an intense static magnetic field, the detector portion comprising a detection coil and a tuning and matching circuit that are placed within the container, the detector portion being cooled by a cooling means such that NMR signals are detected with enhanced sensitivity, said detector portion mounted to an upper end surface or a side surface of said cylindrical portion via heat-insulating means such that the center of the detector coil remains set at a position where the magnetic homogeneity of the intense static magnetic field remains optimal notwithstanding thermal changes due to cooling by the cooling means.

3. An NMR probe having a vacuum-insulated container and a detector portion; the vacuum-insulated container having a cylindrical portion inserted in a magnet, the detector portion being made up of a detection coil and a tuning and matching circuit that are placed within the container, the detector portion being cooled by a cooling means such that NMR signals are detected with enhanced sensitivity, wherein said detector portion is mounted to an upper end surface or a side surface of said cylindrical portion via a heat-insulating member.

4. The NMR probe of claim 3, wherein
(A) said detector portion is fitted with a gas pipe for varying the temperature of a sample, the pipe extending along the center axis of the detector portion,
(B) a bobbin is placed coaxially with the gas pipe outside the gas pipe, and
(C) said detection coil is placed coaxially with the gas pipe and the bobbin.

5. The NMR probe of claim 3 or 4, wherein said detector portion is grounded via a thin plating formed on a surface of said heat-insulating member.

6. The NMR probe of claim 3 or 4, wherein said detector portion is grounded via a thin metal foil sandwiched between said heat-insulating member and said vacuum-insulated container.

7. The NMR probe of claim 3 or 4, wherein said detector portion is cooled by low-temperature helium gas.

8. The NMR probe of claim 3 or 4, wherein said cooling means is fitted with a pipe through which a refrigerant flows, and wherein said pipe has a resilient or movable portion in at least a part thereof.

9. The NMR probe of claim 3 or 4, wherein said detector portion is supported by a support post that is firmly secured to the vacuum-insulated container, and wherein said support post has a resilient or movable portion at least in a part thereof to absorb tensile force or distorting force applied to the support post during thermal shrinkage.

10. The NMR probe of claim 3 or 4, wherein said detector portion is supported by a support post that is firmly secured to the vacuum-insulated container, and wherein said support post is in thermal contact with a gas pipe through which a gas flows, the gas being temperature controlled around room temperature, thus forming a structure preventing thermal shrinkage.

* * * * *